(12) United States Patent
Mukesh et al.

(10) Patent No.: US 12,417,926 B2
(45) Date of Patent: Sep. 16, 2025

(54) CIRCUIT INTERCONNECT STRUCTURE

(71) Applicant: International Business Machines Corporation, Armonk, NY (US)

(72) Inventors: Sagarika Mukesh, Albany, NY (US); Fee Li Lie, Albany, NY (US); Hosadurga Shobha, Shobha, NY (US); Devika Sarkar Grant, Rensselaer, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 749 days.

(21) Appl. No.: 17/562,607

(22) Filed: Dec. 27, 2021

(65) Prior Publication Data

US 2023/0207330 A1  Jun. 29, 2023

(51) Int. Cl.
| H01L 21/3213 | (2006.01) |
| H01L 23/522 | (2006.01) |
| H01L 23/528 | (2006.01) |
| H01L 21/768 | (2006.01) |

(52) U.S. Cl.
CPC .... *H01L 21/32139* (2013.01); *H01L 23/5226* (2013.01); *H01L 23/528* (2013.01); *H01L 21/76892* (2013.01)

(58) Field of Classification Search
CPC ......... H01L 21/32139; H01L 21/76892; H01L 23/5226; H01L 23/528
USPC ....................................................... 257/774
See application file for complete search history.

(56) References Cited

U.S. PATENT DOCUMENTS

| 6,184,121 B1* | 2/2001 | Buchwalter ......... H01L 23/5329 438/618 |
| 9,472,447 B1 | 10/2016 | Kanakasabapathy et al. |
| 9,478,462 B1 | 10/2016 | Wang et al. |
| 9,991,156 B2 | 6/2018 | Burns et al. |
| 10,199,270 B2 | 2/2019 | Bombardier et al. |

(Continued)

OTHER PUBLICATIONS

R. Xie et al., "A 7nm FinFET technology featuring EUV patterning and dual strained high mobility channels," IEEE International Electron Devices Meeting (IEDM), 2016, 2.7, 4 pp.

(Continued)

*Primary Examiner* — Tu-Tu V Ho
(74) *Attorney, Agent, or Firm* — Amin, Turocy & Watson, LLP

(57) ABSTRACT

One or more systems, devices and/or methods provided herein relate to a circuit device having a modular or selectively designed interconnect structure with a plurality of conformal features. In the semiconductor realm, such achievements can allow for fabrication of a device with sub 18 nanometer (nm) or lesser pitch between adjacent and/or parallel lines of the interconnect structure. A device can comprise a semiconductor device having an interconnect structure having a first set of parallel lines and a second set of parallel lines, where the lines of the first set can be arranged in a transverse direction to the lines of the second set. The lines of the first set can be disposed orthogonally to the lines of the second set. The first second sets of lines can comprise first and second rounded jogs that are conformal to one another and which connect the first set of lines to the second set of lines.

20 Claims, 10 Drawing Sheets
(4 of 10 Drawing Sheet(s) Filed in Color)

(56) References Cited

U.S. PATENT DOCUMENTS

| | | | |
|---|---|---|---|
| 10,656,535 B2 | 5/2020 | Ausschnitt et al. | |
| 2014/0049281 A1* | 2/2014 | Liu | G01R 31/318357 716/112 |
| 2017/0271202 A1* | 9/2017 | Xu | H01L 23/49894 |
| 2018/0342421 A1* | 11/2018 | Bombardier | H01L 21/76816 |

OTHER PUBLICATIONS

T. Standaert et al., "BEOL process integration for the 7 nm technology node," IEEE International Interconnect Technology Conference/Advanced Metallization Conference (IITC/AMC), 2016, 2.4, 3 pp.

Mell et al., "The NIST Definition of Cloud Computing," Recommendations of the National Institute of Standards and Technology, NIST Special Publication 800-145, Sep. 2011, 7 pages.

Bekaert et al., "SAQP and EUV block patterning of BEOL metal layers on IMEC's iN7 platform" Mar. 24, 2017 (15 pages.

Halder et al., "Process window discovery methodology for extreme ultraviolet (EUV) lithography" Mar. 26, 2019.

Liang et al., "Integrated approach to improving local CD uniformity in EUV patterning" Mar. 24, 2017 (15 pages).

Fatehy et al., "Exploring EUV and SAQP pattering schemes at 5nm technology node" Mar. 20, 2018.

Decoster et al., "Exploration of EUV-based self-aligned multipatterning options targeting pitches below 20nm" Mar. 25, 2019.

Lariviere et al., "Electrical comparison of iN7 EUV hybrid and EUV single patterning BEOL metal layers" Mar. 23, 2018.

* cited by examiner

CIRCUIT INTERCONNECT STRUCTURE

BACKGROUND

Patterning process, such as double patterning lithography (DPL) and self-aligned quadruple patterning (SAQP), can be employed to fabricate various circuit structures of circuit devices, such as semiconductor devices. These patterning processes can be used for technology nodes that continue to scale down feature pitch from 30 nanometers, to 24 nanometers, and below. In these processes, lithographic processes can be enhanced to produce multiple times the number of features, although with certain limitations.

SUMMARY

The following presents a summary to provide a basic understanding of one or more embodiments described herein. This summary is not intended to identify key or critical elements, delineate scope of particular embodiments or scope of claims. Its sole purpose is to present concepts in a simplified form as a prelude to the more detailed description that is presented later. In one or more embodiments described herein, devices, systems and/or system-implemented methods can facilitate a process to fabricate a circuit device having a modular or selectively designed interconnect structure with a plurality of conformal features. In the semiconductor realm, such achievements can allow for fabrication of a device with sub 18 nanometer (nm) or lesser pitch between adjacent and/or parallel lines of the interconnect structure.

In accordance with an embodiment, a device can comprise a semiconductor device having an interconnect structure, wherein the interconnect structure comprises a first set of parallel lines and a second set of parallel lines, and wherein the lines of the first set are arranged in a transverse direction to the lines of the second set.

In accordance with another embodiment, a system can comprise a semiconductor device comprising a circuit, wherein the circuit comprises an interconnect structure having a first set of parallel lines and a second set of parallel lines, wherein the lines of the first set are arranged in a transverse direction to the lines of the second set, and a set of vias connected across the interconnect structure.

In accordance with yet another embodiment, a method can comprise forming, by self-aligned quadruple patterning (SAQP), by a system operatively coupled to a processor, an interconnect structure of a semiconductor device, the interconnect structure having a first set of parallel lines and a second set of parallel lines, wherein the lines of the first set are arranged in a transverse direction to the lines of the second set.

In one or more embodiments of the aforementioned device, system and/or method, the lines of the first set can be disposed orthogonally to the lines of the second set.

In one or more embodiments of the aforementioned device, system and/or method, the lines of the first set can be arranged a pitch of 18 nanometers or less, and the lines of the second set can be arranged a pitch of 18 nanometers or less.

In one or more embodiments of the aforementioned device, system and/or method, the first set of lines and the second set of lines comprise a rounded jog connecting one line of the first and one line of the second set.

In one or more embodiments of the aforementioned device, system and/or method, the first set of lines and the second set of lines comprise first and second rounded jogs that are conformal to one another and which connect the first set of lines to the second set of lines.

DESCRIPTION OF THE DRAWINGS

The patent or application file contains at least one drawing executed in color. Copies of this patent or patent application publication with color drawing(s) will be provided by the Office upon request and payment of the necessary fee.

DETAILED DESCRIPTION

Figure 1:
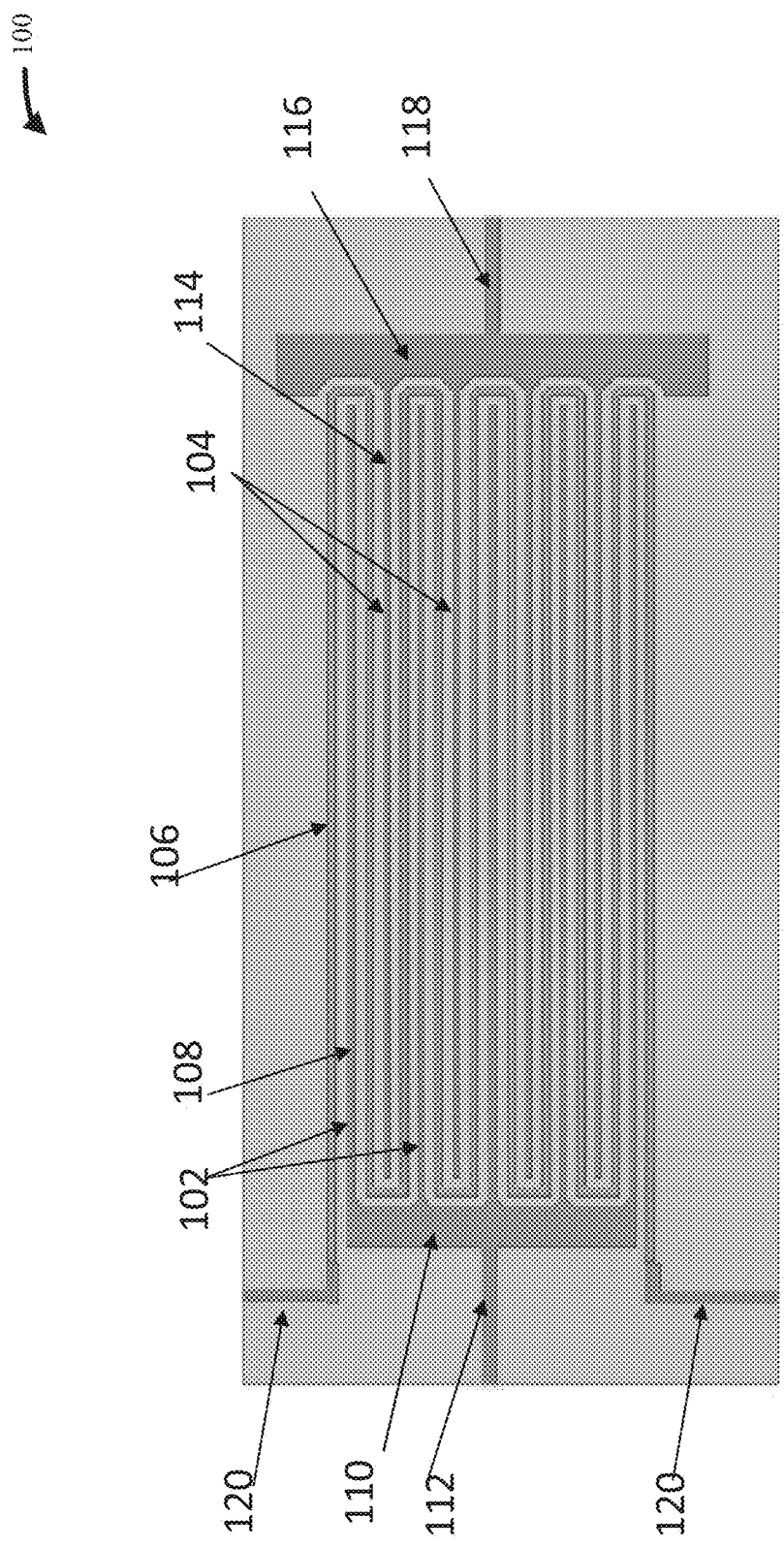
FIG. 1 illustrates a schematic diagram of an example, non-limiting interconnect device, in accordance with one or more embodiments described herein.

The following detailed description is merely illustrative and is not intended to limit embodiments and/or application or utilization of embodiments. Furthermore, there is no intention to be bound by any expressed or implied information presented in the preceding Summary section, or in the Detailed Description section. One or more embodiments are now described with reference to the drawings, wherein like reference numerals are utilized to refer to like elements throughout. In the following description, for purposes of explanation, numerous specific details are set forth in order to provide a more thorough understanding of the one or more embodiments. However, in various cases, that the one or more embodiments can be practiced without these specific details.

Self-aligned quadruple patterning (SAQP) can be considered an extension of DPL and can be expected to be one of the solutions for future process requirements for sub-7 nm technology nodes. SAQP is a patterning approach that can use pitch splitting to further extend capability of lithography techniques. SAQP can be used for both front end of line (FEOL) fin patterning and back end of line (BEOL) metal layers. FEOL can refer to the construction of devices and/or portions of the interconnect at a wafer. BEOL can refer to a later portion of interconnect fabrication, such as where devices such as transistors, capacitors, resistors, vias and/or the like are interconnected with wiring on a wafer, which can be the metallization layer.

For example, BEOL manufacturing patterning at 7 nm technology node can comprise sub-36 nanometer pitches by use of extreme ultraviolet (EUV) lithography or 193 nm-immersion-lithography based SAQP. EUV can face time and complicated challenges in pre-production setups. Existing SAQP technologies can face inability to accurately and efficiently form interconnect structures with sub-24 pitch and/or with conformal features.

Inability to fabricate the desired structure can lead to various issues during use of the interconnect devices. These issues can include containing parasitic resistance and capacitance, scaling wire resistance, scaling barrier films, meeting reliability requirements for time-dependent dielectric breakdown and electromigration, avoidance of defects, non-conformal features, planarization, barrier capping and/or the like.

One or more devices, systems and/or methods described herein can account for one or more of these deficiencies, and thereby allowing for effective and custom-designed interconnect devices fabricated efficiently and with minimal stages. That is, one or more embodiments described herein can provide for one or more methods for forming a semiconductor device and/or interconnect device that can comprise a multi-track jogged layout, such as can be desired for BEOL manufacturing, such as BEOL manufacturing patterning with 18 nm or sub 18 nm pitches. That is, for one or more technology nodes, pairs of lines and/or pairs of jogs can be provided at the minimum ground rule for those one or more technology nodes.

Employing the methods and/or devices defined herein can allow for an interconnect device having lines in close proximity in both primary and non-primary directions. In view of use of SAQP, such lines can be continuous portions that can be conformal to one another, and can comprise conformal parallel lines, jogs, and/or serpentine portions. The jogs (e.g., turns) can be formed without any additional cuts or masks as are used in existing technologies that result in non-conformal or even non-rounded connections or turns.

Applying cuts at different stages of the fabrication process, such as after deposition of first or second spacers, or after dielectric fill, can allow for disconnect between portions of the interconnect structure and/or for multiple pitch thick sections (e.g., sections having thicknesses of multiple lines combined). This line merging or disconnect can allow for a variety of selectively designed interconnect structures that can be designed according to one or more desired patterns of an entity.

Generally, a resultant interconnect device can comprise a first set of parallel lines and a second set of parallel lines, where the lines of the first set can be arranged in a transverse direction to the lines of the second set. The lines of the first set can be disposed orthogonally to the lines of the second set. The first second sets of lines can comprise first and second rounded jogs that are conformal to one another and which can connect the first set of lines to the second set of lines.

Turning now to the figures, to accomplish one or more of these features, one or more operations will now be described relative to one or more features of the illustrated interconnect devices. One or more embodiments are now described with reference to the drawings, where like referenced numerals are used to refer to like elements throughout. As used herein, the terms "entity", "requesting entity" and "user entity" can refer to a machine, device, component, hardware, software, smart device and/or human. In the following description, for purposes of explanation, numerous specific details are set forth in order to provide a more thorough understanding of the one or more embodiments. However, in various cases, that the one or more embodiments can be practiced without these specific details.

Generally, the subject computer processing system(s), methods, apparatuses, devices and/or computer program products can be employed to solve new problems that can arise through advancements in technology, computer networks, the Internet and the like.

Further, the embodiments depicted in one or more figures described herein are for illustration only, and as such, the architecture of embodiments is not limited to the systems, devices and/or components depicted therein, nor to any particular order, connection and/or coupling of systems, devices and/or components depicted therein. For example, in one or more embodiments, the non-limiting systems described herein, such as non-limiting system 100 as illustrated at FIGS. 1, and/or systems thereof, can further comprise, be associated with and/or be coupled to one or more computer and/or computing-based elements described herein with reference to an operating environment, such as the operating environment 800 illustrated at FIG. 8. In one or more described embodiments, computer and/or computing-based elements can be used in connection with implementing one or more of the systems, devices, components and/or computer-implemented operations shown and/or described in connection with FIG. 1 and/or with other figures described herein.

Additionally, the following description and drawings can be applicable to a multi-track jogged layout for BEOL patterning, for FEOL patterning such as FEOL fin patterning, and/or for other patterning.

Turning first generally to FIG. 1, an embodiment of an interconnect device 100 is illustrated.

The interconnect device 100 includes varying types of lines and spaces having 18 nm or sub-18 nm pitch. Various tracks are included with various disconnects between. A base layout has a serpentine structure with parallel adjacent lines and conformal jogs or turns of lines. These structures and layouts can be fabricated employing SAQP, such as in combination with either immersion lithography or EUV, which can advantageously and efficiently be used to minimize the number of steps and non-conformal features of existing technologies.

The double comb embodiment of the interconnect device 100 has a double serpentine comb structure. Illustrated are the ILD filled areas 102 that result after use of two stages of mandrels and two stages of conformal spacers. The ILD filled areas 102 include one track 104 having lines 106 spaced apart by tines 108 of a first portion of the ILD filled areas 102 and by tines 114 of a second portion of the ILD filled areas 104.

That is, as illustrated, the interconnect device 100 comprises a pair of tracks 102 and 104 that are running parallel and traversing each other and a serpentine track 106 that is running conformal to and in between track 102 and 104. The track 102 can comprise of a plurality of minimal ground rule lines 108, which are shorted together by line 110 and connected to other wiring network or devices through line 112. The track 104 can comprise of a plurality of minimal ground rule lines 114, which can be shorted together by line 116 and can be connected to other wiring network or devices through line 118. The track 106 can comprise of minimum ground rule line 106 and can be connected to other wiring network or device through line 120.

Tracks 102, 104 and serpentine track 106 can be constructed at minimum distance from each other with track 102 turns at minimum distance to the tip of each lines in track 102 and 104 as a result of the SAQP process. Lines 110, 112, 116, 118, and 120 which either short multiple tracks and/or connect these tracks to other wiring network or devices are formed by employing one or more cuts after first or second spacer deposition or after dielectric fill deposition.

Figure 2:
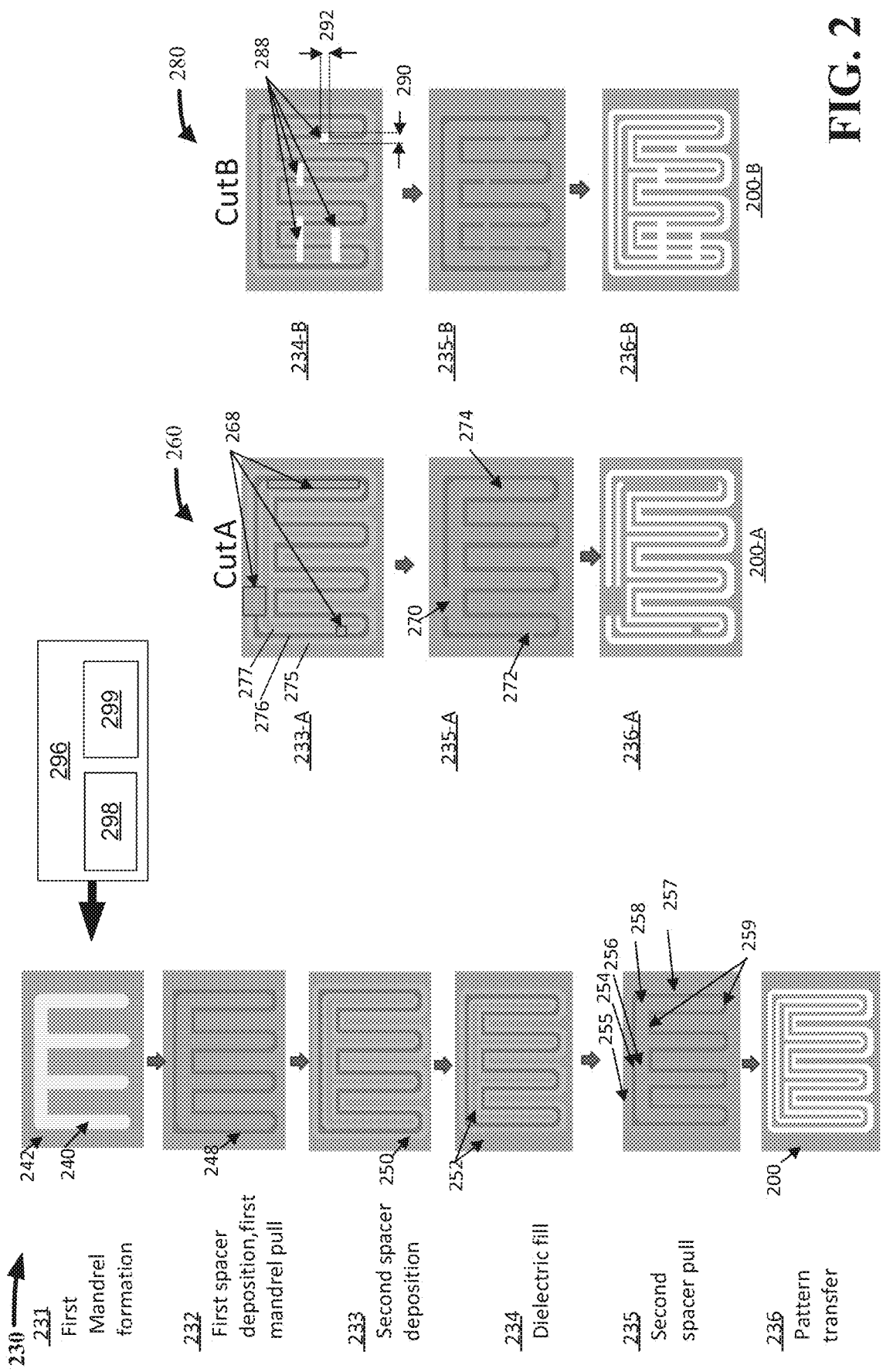
FIG. 2 illustrates various fabrication stages of an interconnect device, in accordance with one or more embodiments described herein.

Looking next to FIG. 2, another embodiment of an interconnect device 200 is illustrated with different stages being illustrated for forming the interconnect device 200.

A process 230 for fabricating the interconnect device 200 can include the stages 231-236.

At stage 231, an initial comb-shaped mandrel 240 can be applied to a substrate 242. For example, an initial comb-shaped mandrel 240 can be applied to the substrate 242, such as via a single exposure immersion lithography or EUV lithography followed by RIE. Substrate 242 can comprise prior level device and or interconnect layers.

At stage 232, a first conformal spacer 248 can be deposited, such as via atomic layer deposition or other suitable process, about an external periphery of the initial comb-shaped mandrel 240, and thus conforming to the outer periphery of the initial comb-shaped mandrel 240. The initial comb-shaped mandrel 240 can be removed, such as via etch or other suitable process.

At stage 233, a second conformal spacer 250 can be deposited, such as via atomic layer deposition or other suitable process. The second conformal spacer 250, can be deposited around the first conformal spacer 248. In one embodiment, the second conformal spacer 250 can be deposited in two portions, such as conforming with an outer periphery of the first conformal spacer 248 at a first portion, and conforming with an inner periphery of the first conformal spacer 248 at second portion.

At stage 234, a dielectric deposition fill 252 can be employed to fill peripherally outside of the second conformal spacer 250 and also to filler peripherally inside of the second conformal spacer 250.

At stage 235, the second conformal spacer 250 can be removed to reveal a pattern that can be transferred to metal to form interconnect metal device 200. The interconnect pattern can include pairs of lines 254 and 256 at the minimum ground rule width and pitch, and line 255 at minimum spacing from the pairs of lines 254 and 256 for a particular technology, where the lines are disposed in a nonprimary (e.g., transverse) direction to lines 257. The interconnect pattern can include multiple pairs of metal line turns 258 at four times the minimum pitch, such as on a first mandrel side. Likewise, the interconnect pattern can include multiple pairs of turns 259 at two times the minimum pitch, such as on a first spacer side.

At stage 236, the revealed pattern of stage 235 can be transferred to metal to form the interconnect metal device 200.

Also at FIG. 2, two different schematics are illustrated at 260 (cut A) and 280 (cut B) to depict different cuts that can be made at different stages of the fabrication of the interconnect device 200.

At stage 233-A of schematic diagram 260, one or more cuts 268 can be performed after deposition of first and second portions of the second conformal spacer 250, such as after stage 233. The cuts can reveal the substrate below, and thus can provide spaces to be filled with the dielectric fill 252.

Accordingly, as shown stage 235-A, after dielectric fill 252 and pull of the second conformal spacer 250, a merge line 270 can result combining three different lines, and thus connecting the three tracks 275-277 (e.g., of the dielectric fill 252 and first conformal spacer 248). A merge node of 272 can be formed to connect different parts of tracks 275 and 277. A wider cut in the primary direction (e.g., relative to lines 257) can result in merging of two or more tracks to form line pattern 274 at larger than critical dimension.

At stage 236-A, the dielectric 252, the second spacer 218, including the merge lines 270, 272, and 274 can be transferred to a metallization layer to form the modified interconnect device 200-A.

At stage 234-B of schematic diagram 280, one or more cuts 288 can be performed after dielectric fill 252 is performed, such as after stage 234. One or more cuts 288 can be performed across two or more tracks at primary and non-primary directions, e.g., the directions of lines that are transverse to one another, such as being orthogonal to one another. One or more cuts 288 of shape 290, in a direction perpendicular/orthogonal to a track being cut, can be performed on the second conformal spacer 250, such as with width variation tolerance less than the second conformal spacer critical dimension. One or more cuts 288 can have a width 292 that can define a metal to metal tip to tip.

At stage 235-B, such as after the second conformal spacer 250 is removed at stage 235, the dielectric 252 and first conformal spacer 248 can remain with a plurality of disconnected sections.

At stage 236-B, the dielectric 252 and first conformal spacer 248, including the disconnected sections thereof, can be transferred to a metallization layer to form the modified interconnect device 200-B.

In one or more embodiments, both cut types of both schematic diagrams 550 and 580 can be performed during a same fabrication of an interconnect device, such as has resulted at the interconnect device 100 of FIG. 1.

In one or more embodiments, contact via(s) can be formed to connect any of the aforementioned line segments or tracks to the next metal section (e.g., along a track, after a break in a track due to one of the aforementioned cuts).

Figure 3:
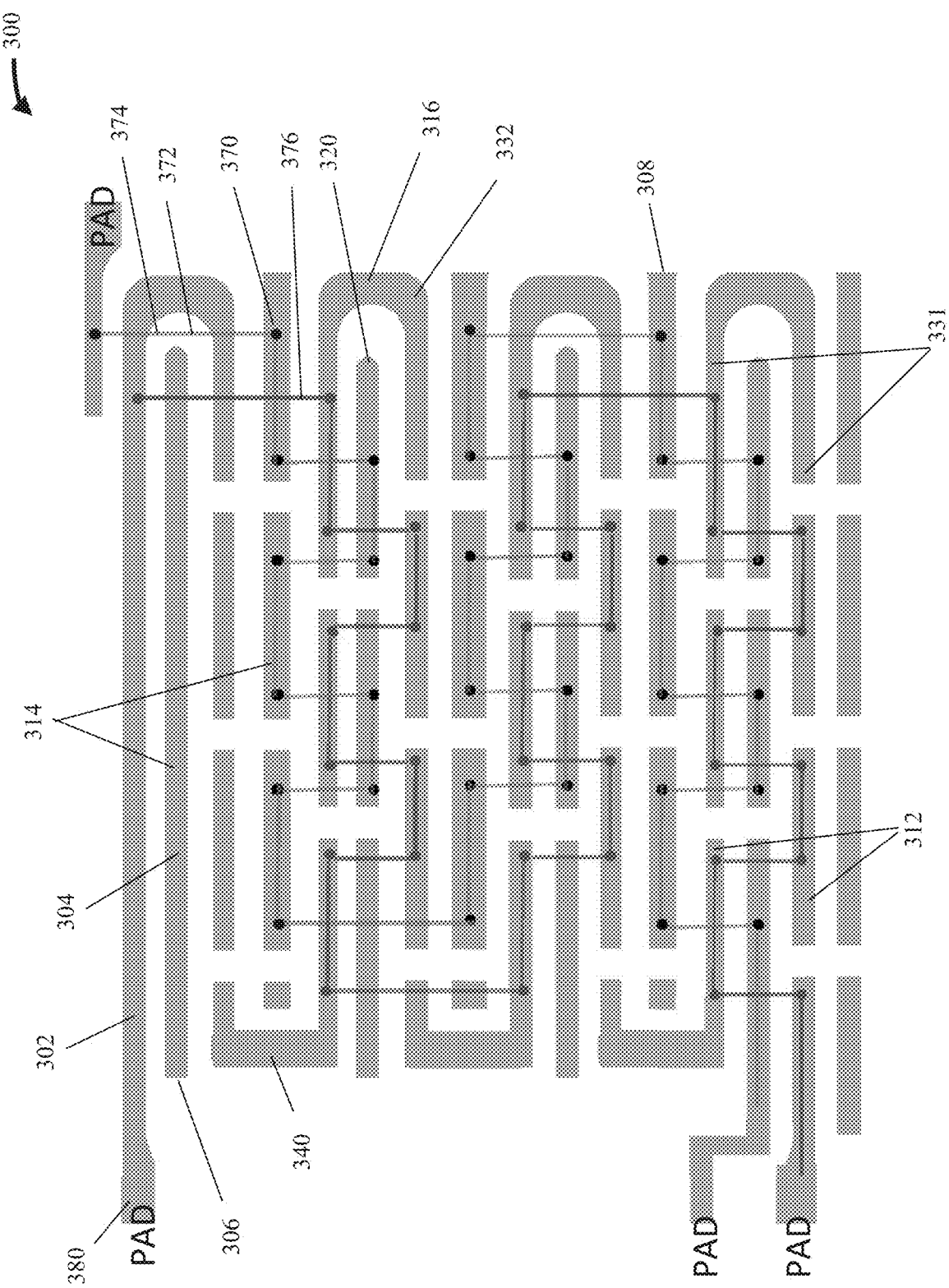
FIG. 3 illustrates a schematic diagram of an example, non-limiting interconnect device, in accordance with one or more embodiments described herein.

In one or more embodiments, both cut types of both schematic diagrams 260 and 280 can be performed during a same fabrication of an interconnect device, such as has resulted at the interconnect device 300 of FIG. 3.

In one or more embodiments, one or more operations for fabricating the one or more interconnect devices described herein, such as the interconnect device 200, can be performed by a manufacturing system, such as a manufacturing system 296 comprising one or more manufacturing devices 298, where the manufacturing system 296 is operatively coupled to a processor 299 for at least partially controlling the one or more operations. The processor 299 can be any suitable processor. Discussion proved below with respect to processor 806 can be at least partially equally applicable to the processor 299.

In one or more embodiments, the manufacturing system 296 can be configured, such as by one or more operations performed by one or more of the manufacturing devices 298 in view of one or more instructions provided by the processor 299, to construct the interconnect device 200, such as relative to a substrate. The manufacturing devices 298 can, among other operations, perform atomic layer deposition, interlayer deposition, mandrel placement and/or removal, cuts, EUV, transfer to a metallization layer, and/or the like.

Turning next generally to FIG. 3, an illustrative layout pattern of an interconnect device 300 is depicted. Repetitive description of like elements and/or processes employed in respective embodiments is omitted for sake of brevity.

The interconnect device 300 includes varying types of lines and spaces having 18 nm or sub-18 nm pitch. Various tracks are included with various disconnects between. A base layout has a serpentine structure with parallel adjacent lines and conformal jogs or turns of lines. These structures and layouts can be fabricated employing SAQP, such as in combination with either immersion lithography or EUV, which can advantageously and efficiently be used to minimize the number of steps and non-conformal features of existing technologies.

As illustrated, the interconnect device 300 comprises a pair of conformal tracks 302 and 304 that have been at least partially disconnected (such as at locations 306 and 308) by cuts performed after interlayer dielectric (ILD) fill. The conformal track 302 comprises groups of lines 312, and the conformal track 304 comprises groups of lines 314. A plurality of conformal jogs 316 and turns 320 are formed by the groups of lines 312 and 314. That is a line 312 can include a turn 320 of the line 314, which turn 320 can be conformal to the jog 316 connecting lines 312.

Referring now to the track 302, but also applicable to the track 304, the track 302 comprises a first set of lines 331 and a second set of lines 332. The lines of the set 331 can be transversely aligned to the lines of the second set 332. As shown, the lines of the set 331 can be orthogonally aligned to the lines of the second set 332. That is, the sets of lines 331 can be a primary set aligned in a primary direction, where the set of lines 332 can be a non-primary set aligned in a non-primary direction. Lines of the first set 331 can be connected to lines of the second set 332 by the jogs 316 of the track 302.

Additionally, additional merge lines 340 can be formed, such as by employing one or more cuts after deposition of one or more spacers. In the same way, merge lines can be formed having a combined thickness or width of a plurality of lines over multiple pitches.

Referring still to FIG. 3, a plurality of vias 370 can be connected to, such as through the interconnect device 100. Connections can be made between the vias 370 such as via suitable connects 372 at a metal level above and or below interconnect device 300 and disconnected portions of the interconnect device 300. In this way, one or more via chains can be formed. As shown, two via chains 374 and 376 are formed.

The interconnect device 300 can include a plurality of pads 380, such as two pairs of pads 380, with each track 302 and 304 (e.g., each via chain 374 and 376) having a pair of the pads 380. Electrical or other connections can be made to the pads 380 to apply a current/voltage across the interconnect device 300 to perform a test, such as of continuity and/or resistance, of the experimental setup comprising the vias 370 and the interconnect device 300.

Although not shown other devices, components and/or elements can be connected to and/or through the interconnect device 300 to satisfy a suitable (back end of line) BEOL configuration or (front end of line) FEOL configuration.

Figure 4:
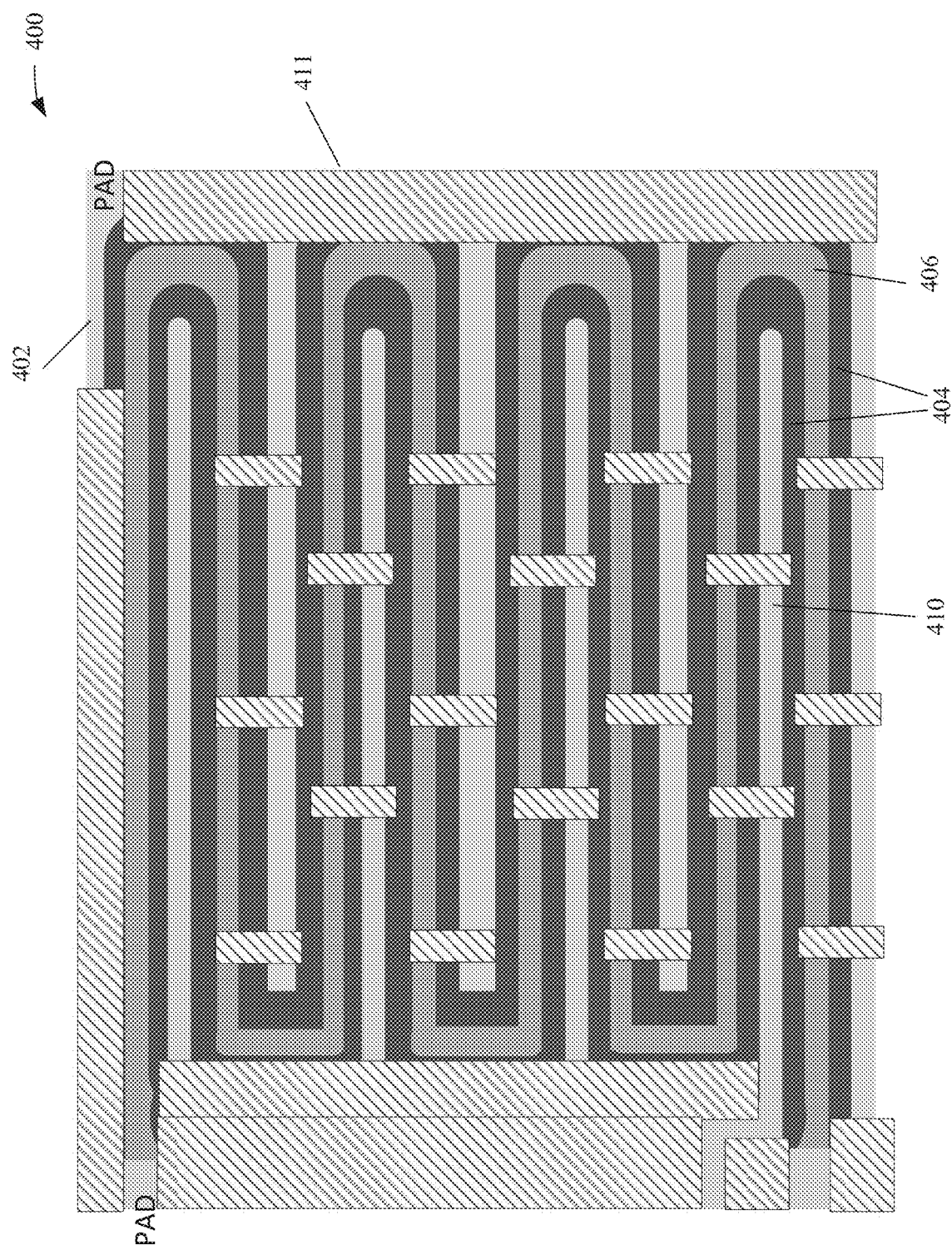
FIG. 4 illustrates a schematic diagram of fabrication stage of the non-limiting interconnect device of FIG. 1, in accordance with one or more embodiments described herein.

Turning next to FIG. 4, one or more stages of fabrication of the interconnect device 300 are together illustrated in one schematic diagram. For example, it is illustrated that the tracks 302 and 304 can be formed using comb-shaped mandrels. For example, an initial mandrel can be applied to a substrate 402. A conformal spacer 404 can be deposited, such as via atomic layer deposition or other suitable process, about an external periphery of the initial mandrel, and thus conforming to the initial mandrel. The initial mandrel can be removed, and another conformal spacer 406 can be deposited within space between the conformal spacer 404. Once this second mandrel is removed, interlayer deposition (ILD) fill 410 can be employed to fill within the spacers 404 and 406.

With or without the spacers 404 and 406 being removed, the plurality of disconnect cuts 411 (having diagonal pattern filled shapes at FIG. 4) can be made, thereby forming a plurality of disconnected sections of the ILD filled area. This can result in an ILD form that can be employed to fabricate the metallization layer 300 of FIG. 3.

Figure 5:
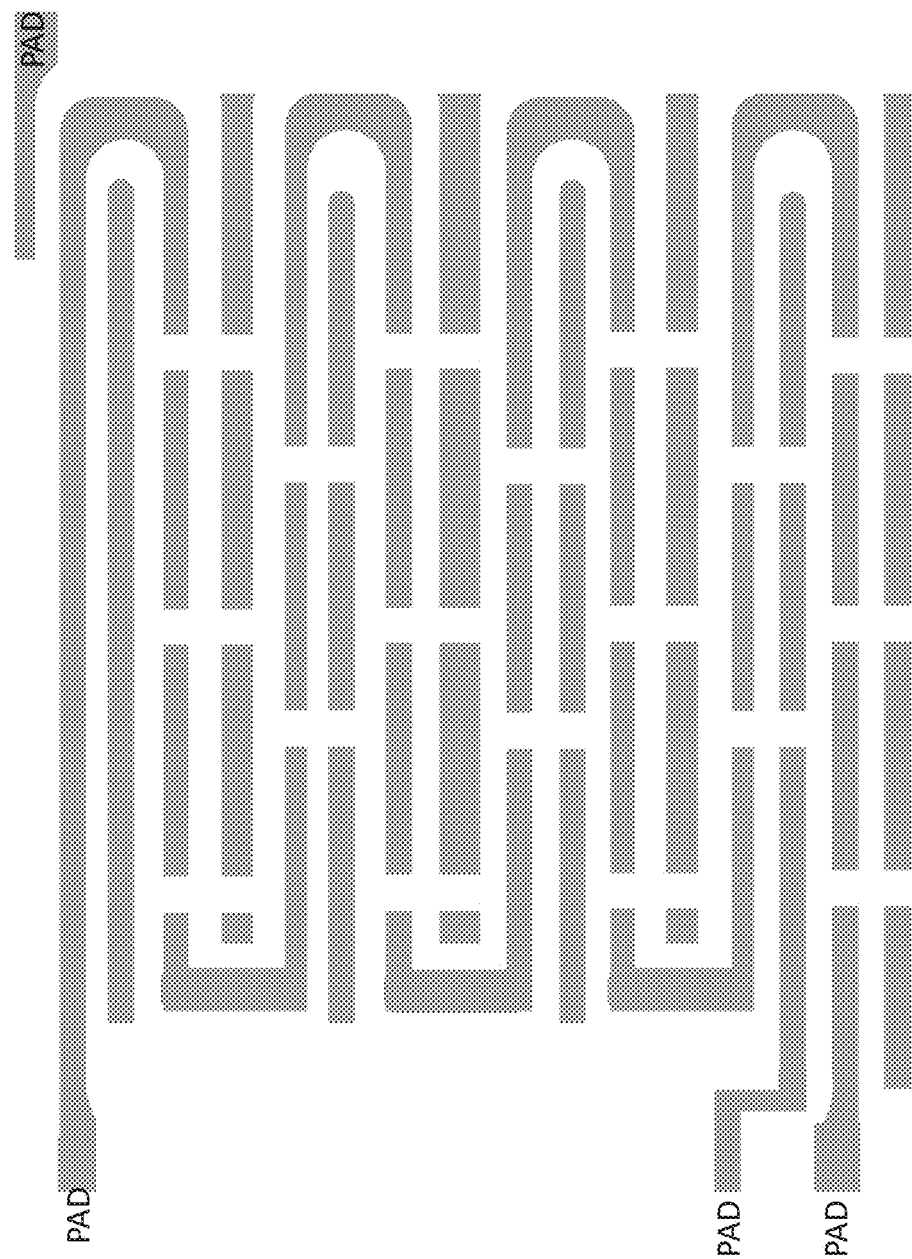
FIG. 5 illustrates a schematic diagram of another fabrication stage of the non-limiting interconnect device of FIG. 1, in accordance with one or more embodiments described herein.

Looking now to FIG. 5, after the mandrels are removed, the conformal spacers 404 and 406 deposited and removed, and plurality of cuts 411 made, a pattern can remain. That pattern can be employed to fabricate a replica metallization layer 500 of the interconnect device 300.

Figure 6:
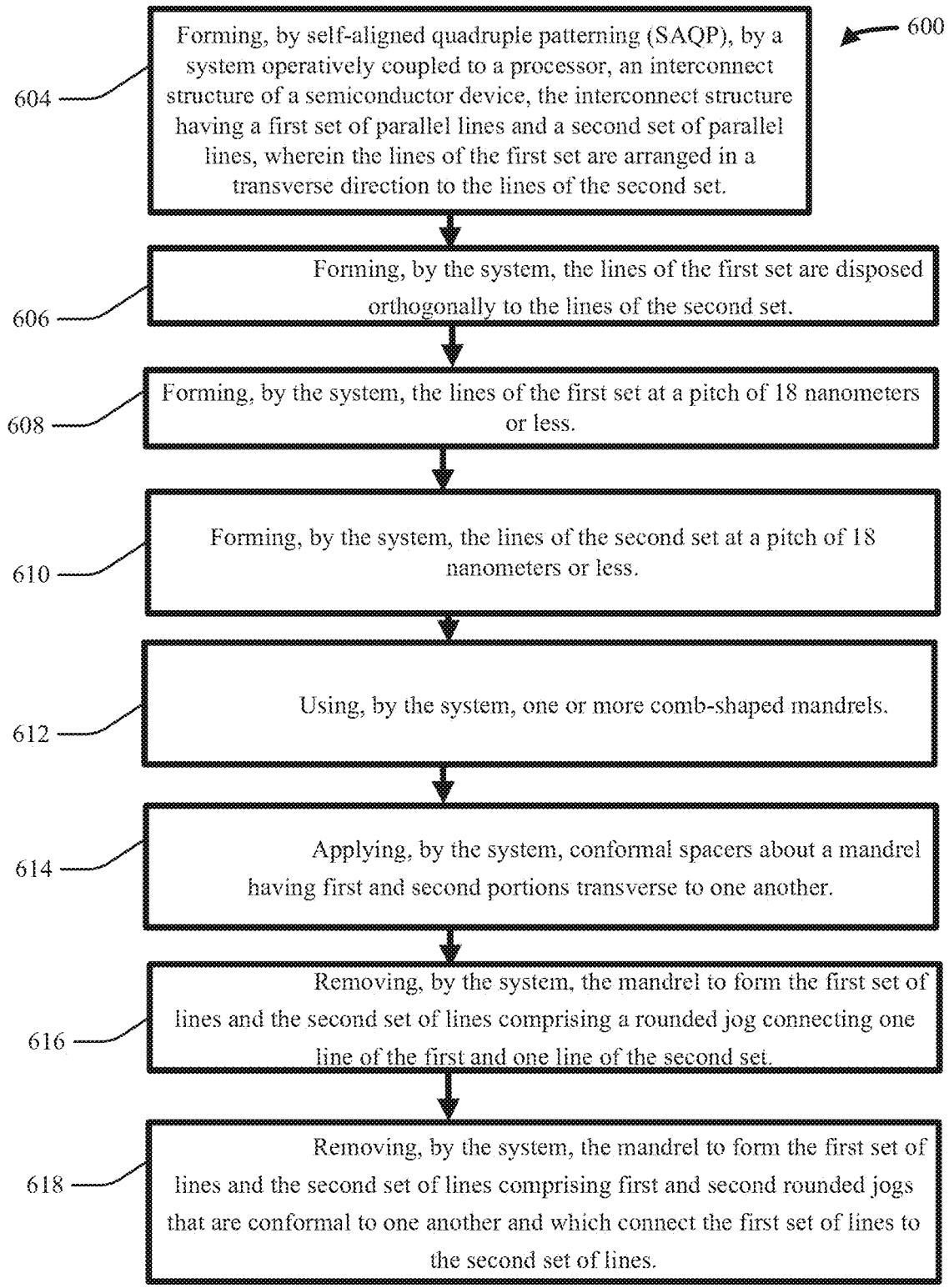
FIG. 6 illustrates a flow diagram of an example method to fabricate an interconnect device, in accordance with one or more embodiments described herein.

Next, FIG. 6 illustrates a flow diagram of an example, non-limiting method 600 that can facilitate a process to fabricate an interconnect device, in accordance with one or more embodiments described herein. While the non-limiting method 600 is described relative to the interconnect device 100 of FIG. 1, the non-limiting method 600 can be applicable also to other systems and/or devices described herein, such as the interconnect devices illustrated at FIGS. 3, 4, and 5. Repetitive description of like elements and/or processes employed in respective embodiments is omitted for sake of brevity.

At 604, the non-limiting method 600 can comprise forming, by self-aligned quadruple patterning (SAQP), by a system operatively coupled to a processor (e.g., system 296), a semiconductor device comprising an interconnect structure having a first set of parallel lines and a second set of parallel lines, wherein the lines of the first set are arranged in a transverse direction to the lines of the second set.

At 606, the non-limiting method 600 can comprise forming, by the system (e.g., system 296), the lines of the first set are disposed orthogonally to the lines of the second set.

At 608, the non-limiting method 600 can comprise forming, by the system (e.g., system 296), the lines of the first set at a pitch of 18 nanometers or less.

At 610, the non-limiting method 600 can comprise forming, by the system (e.g., system 296), the lines of the second set at a pitch of 18 nanometers or less.

At 612, the non-limiting method 600 can comprise using, by the system (e.g., system 296), one or more comb-shaped mandrels. At 612, the non-limiting method 600 also can comprise forming, by the system (e.g. system 296), comb-shaped mandrels the prongs of which can extend in transverse directions, and which can be symmetrical or asymmetrical.

At 614, the non-limiting method 600 can comprise applying, by the system (e.g., system 296), conformal spacers about a mandrel having first and second portions transverse to one another.

At 616, the non-limiting method 600 can comprise removing, by the system (e.g., system 296), the mandrel to form the first set of lines and the second set of lines comprising a rounded jog connecting one line of the first and one line of the second set.

At 618, the non-limiting method 600 can comprise removing, by the system (e.g., system 296), the mandrel to form the first set of lines and the second set of lines comprising first and second rounded jogs that are conformal to one another and which connect the first set of lines to the second set of lines.

Figure 7:
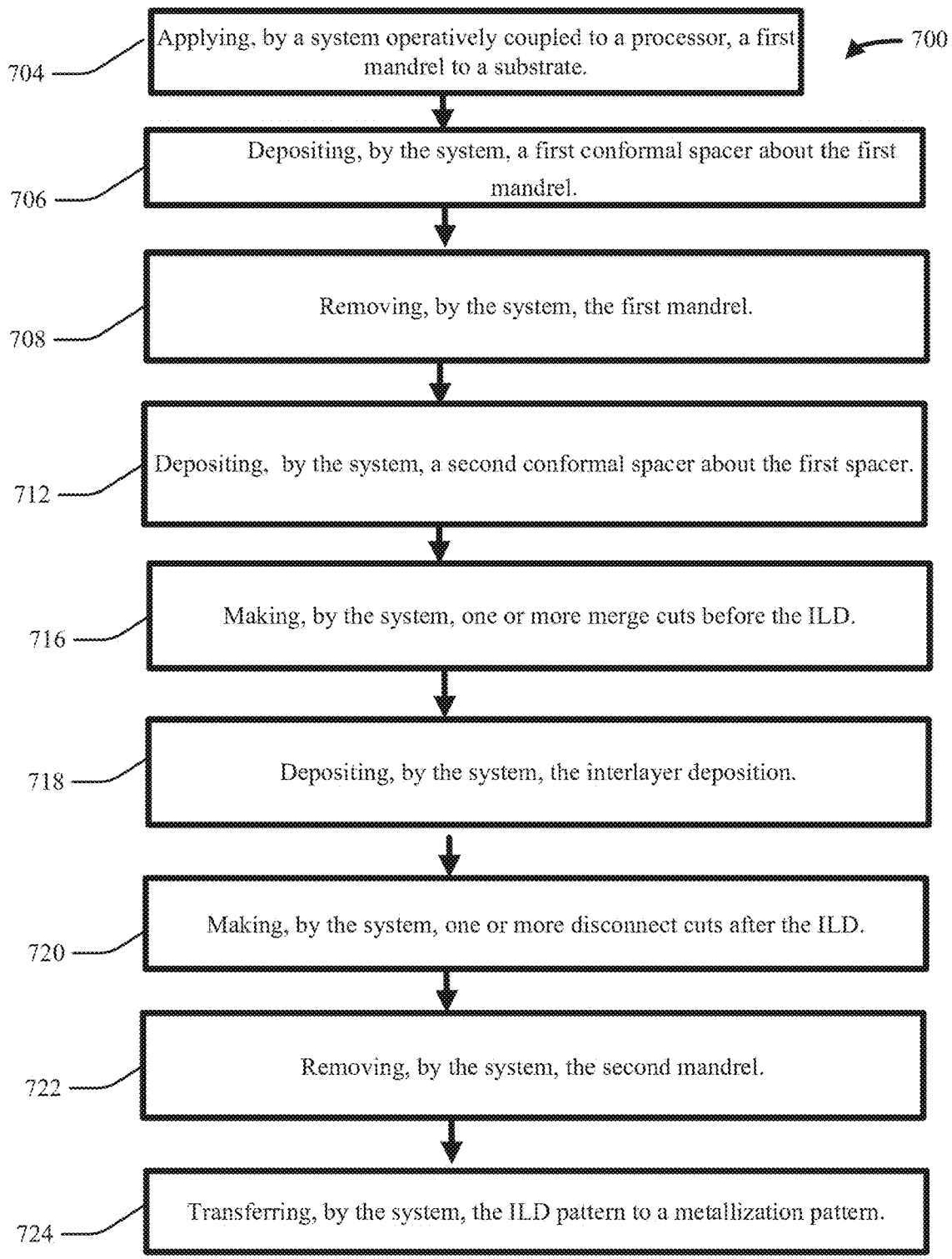
FIG. 7 illustrates a flow diagram of another example method to fabricate an interconnect device, in accordance with one or more embodiments described herein.

Next, FIG. 7 illustrates a flow diagram of an example, non-limiting method 700 that can facilitate a process to fabricate an interconnect device, in accordance with one or more embodiments described herein. While the non-limiting method 700 is described relative to the interconnect device 100 of FIG. 1, the non-limiting method 700 can be applicable also to other systems and/or devices described herein, such as the interconnect devices illustrated at FIGS. 4 and 5. Repetitive description of like elements and/or processes employed in respective embodiments is omitted for sake of brevity.

At 704, the non-limiting method 700 can comprise applying, by a system operatively coupled to a processor (e.g., system 296), a first mandrel to a substrate.

At 706, the non-limiting method 700 can comprise depositing, by the system (e.g., system 296), a first conformal spacer about the first mandrel.

At 708, the non-limiting method 700 can comprise removing, by the system (e.g., system 296), the first mandrel.

At 712, the non-limiting method 700 can comprise depositing, by the system (e.g., system 296), a second conformal spacer about the first spacer.

At 716, the non-limiting method 700 can comprise making, by the system (e.g., system 296), one or more merge cuts before the ILD.

At 718, the non-limiting method 700 can comprise depositing, by the system (e.g., system 296), the interlayer deposition.

At 720, the non-limiting method 700 can comprise making, by the system (e.g., system 540), one or more disconnect cuts after the ILD.

At 722 the non-limiting method 700 can comprise removing, by the system (e.g., system 296), the second conformal spacer At 724, the non-limiting method 700 can comprise transferring, by the system (e.g., system 296), the ILD pattern to a metallization pattern.

For simplicity of explanation, the computer-implemented and non-computer-implemented methodologies provided herein are depicted and/or described as a series of acts. The subject innovation is not limited by the acts illustrated and/or by the order of acts, for example acts can occur in one or more orders and/or concurrently, and with other acts not presented and described herein. Furthermore, not all illustrated acts can be utilized to implement the computer-implemented and non-computer-implemented methodologies in accordance with the described subject matter. In addition, the computer-implemented and non-computer-implemented methodologies could alternatively be represented as a series of interrelated states via a state diagram or events. Additionally, the computer-implemented methodologies described hereinafter and throughout this specification are capable of being stored on an article of manufacture to facilitate transporting and transferring the computer-implemented methodologies to computers. The term article of manufacture, as used herein, is intended to encompass a computer program accessible from any computer-readable device or storage media.

In summary, one or more systems, devices and/or methods provided herein relate to a circuit device having a modular or selectively designed interconnect structure with a plurality of conformal features. In the semiconductor realm, such achievements can allow for fabrication of a device with sub 18 nanometer (nm) or lesser pitch between adjacent and/or parallel lines of the interconnect structure. A device can comprise an interconnect structure having a first set of parallel lines and a second set of parallel lines, where the lines of the first set can be arranged in a transverse direction to the lines of the second set. The lines of the first set can be disposed orthogonally to the lines of the second set. The first second sets of lines can comprise first and second rounded jogs that are conformal to one another and which can connect the first set of lines to the second set of lines.

Referring now to FIGS. 1 to 7, an in addition to the above summary, employing the methods and/or devices defined herein can allow for an interconnect device having lines in close proximity in both primary and non-primary directions. In view of use of SAQP, such lines can be continuous portions that can be conformal to one another, and can comprise conformal parallel lines, jogs, and/or serpentine portions. The jogs (e.g., turns) can be formed without any additional cuts or masks as are used in existing technologies that result in non-conformal or even non-rounded connections or turns.

Applying cuts at different stages of the fabrication process, such as after deposition of first or second spacers, or after ILD fill, can allow for disconnect between portions of the interconnect structure and/or for multiple pitch thick sections (e.g., sections having thicknesses of multiple lines combined). This line merging or disconnect can allow for a variety of selectively designed interconnect structures that can be designed according to one or more desired patterns of an entity.

Indeed, in view of the one or more embodiments described herein, a practical application of the interconnect structures described herein can be used in an experimental setup for testing via setups or in a semiconductor device. The experimental setup can be replicated with desired distances and turns between vias by employing the one or more devices and/or methods described herein. The fabrication can be a useful and practical application of computers, providing selectively unique and/or modular interconnect structures via a processor-controlled manufacturing process. The interconnect devices can be a useful and practical medium for building in the semiconductor realm.

The systems and/or devices have been (and/or will be further) described herein with respect to interaction between one or more components. Such systems and/or components can include those components or sub-components specified therein, one or more of the specified components and/or sub-components, and/or additional components. Sub-components can be implemented as components communicatively coupled to other components rather than included within parent components. One or more components and/or sub-components can be combined into a single component providing aggregate functionality. The components can interact with one or more other components not specifically described herein for the sake of brevity, but known by those of skill in the art.

One or more embodiments described herein can be, in one or more embodiments, inherently and/or inextricably tied to computer technology and cannot be implemented outside of a computing environment. For example, one or more fabrication processes performed by one or more embodiments described herein can more efficiently, and even more feasibly, facilitate program and/or program instruction execution, such as relative to interconnect fabrication, as compared to existing systems and/or techniques. Systems, computer-implemented methods and/or computer program products facilitating performance of these processes are of great utility in the field of semiconductor systems and cannot be equally practicably implemented in a sensible way outside of a computing environment.

One or more embodiments described herein can employ hardware and/or software to solve problems that are highly technical, that are not abstract, and that cannot be performed as a set of mental acts by a human. For example, a human, or even thousands of humans, cannot efficiently, accurately and/or effectively fabricate an interconnect device, as the one or more embodiments described herein can facilitate this process. And, neither can the human mind nor a human with pen and paper fabricate an interconnect device, as conducted by one or more embodiments described herein.

In one or more embodiments, one or more of the processes described herein can be performed by one or more specialized computers (e.g., a specialized processing unit, a specialized classical computer, a specialized quantum computer, a specialized hybrid classical/quantum system and/or another type of specialized computer) to execute defined tasks related to the one or more technologies describe above. One or more embodiments described herein and/or components thereof can be employed to solve new problems that arise through advancements in technologies mentioned above, employment of quantum computing systems, cloud computing systems, computer architecture and/or another technology.

One or more embodiments described herein can be fully operational towards performing one or more other functions (e.g., fully powered on, fully executed and/or another function) while also performing the one or more operations described herein.

Figure 8:
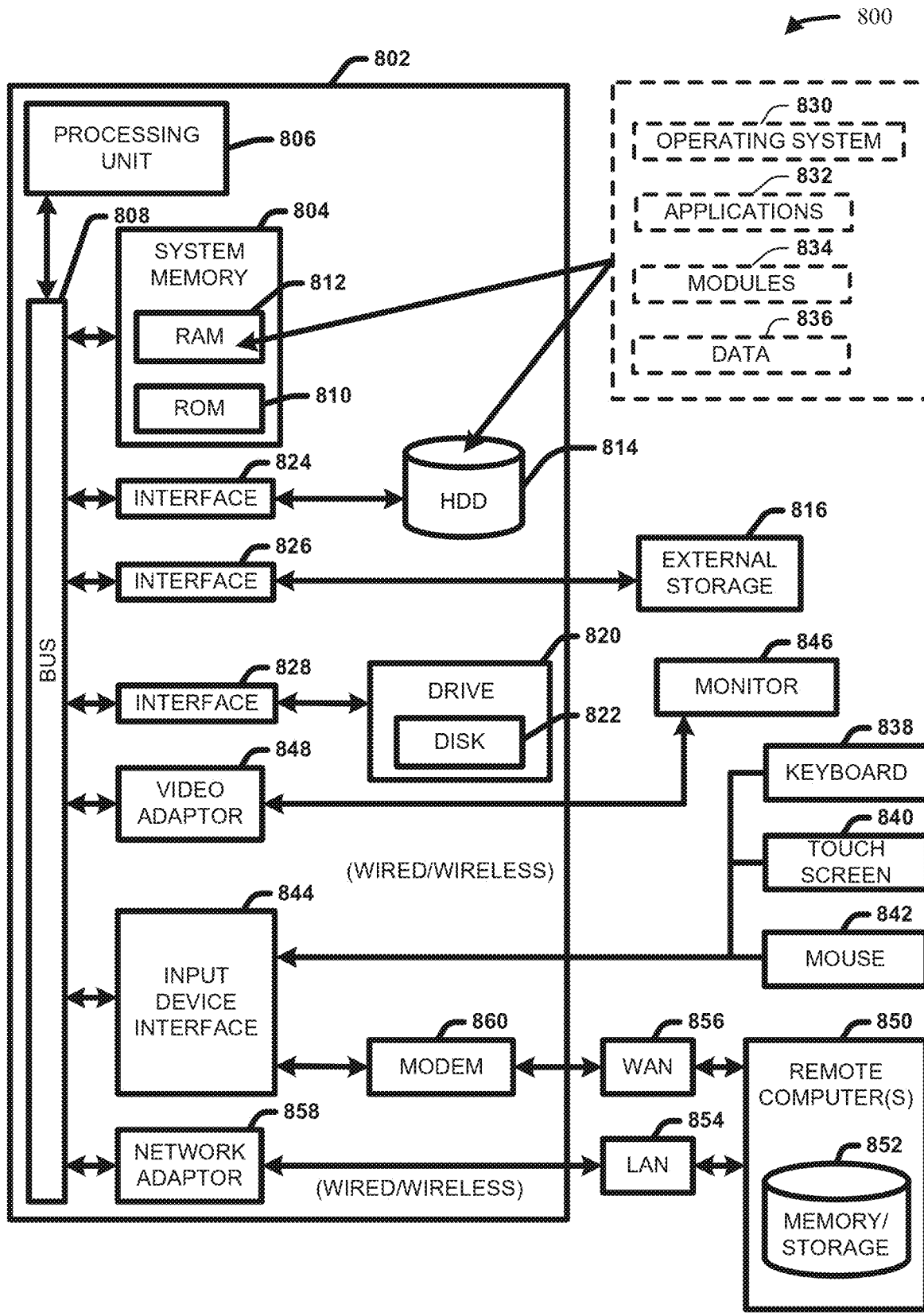
FIG. 8 illustrates a block diagram of an example, non-limiting, operating environment in which one or more embodiments described herein can be facilitated.
Figure 9:
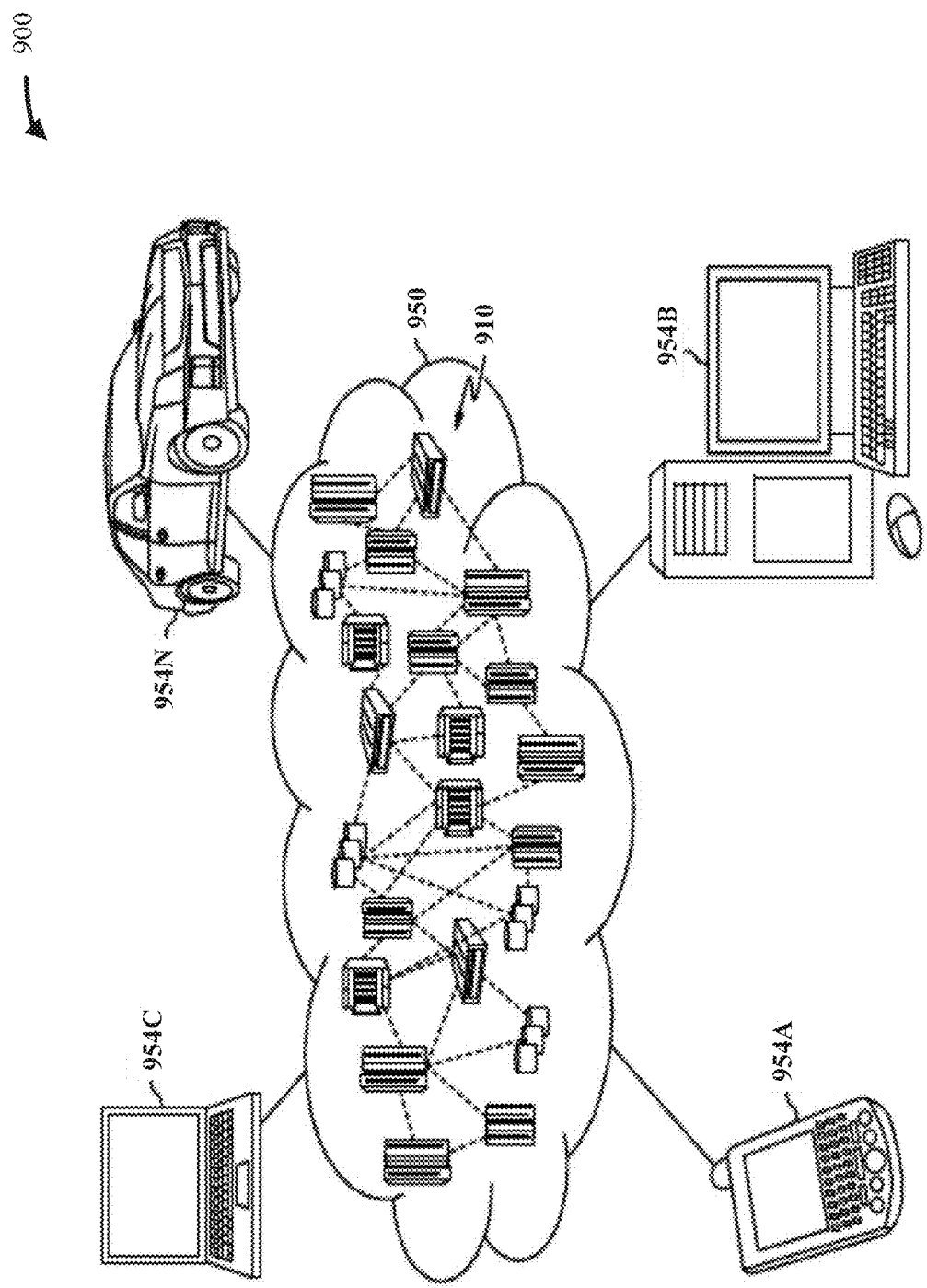
FIG. 9 illustrates a block diagram of an example, non-limiting, cloud computing environment in accordance with one or more embodiments described herein.
Figure 10:
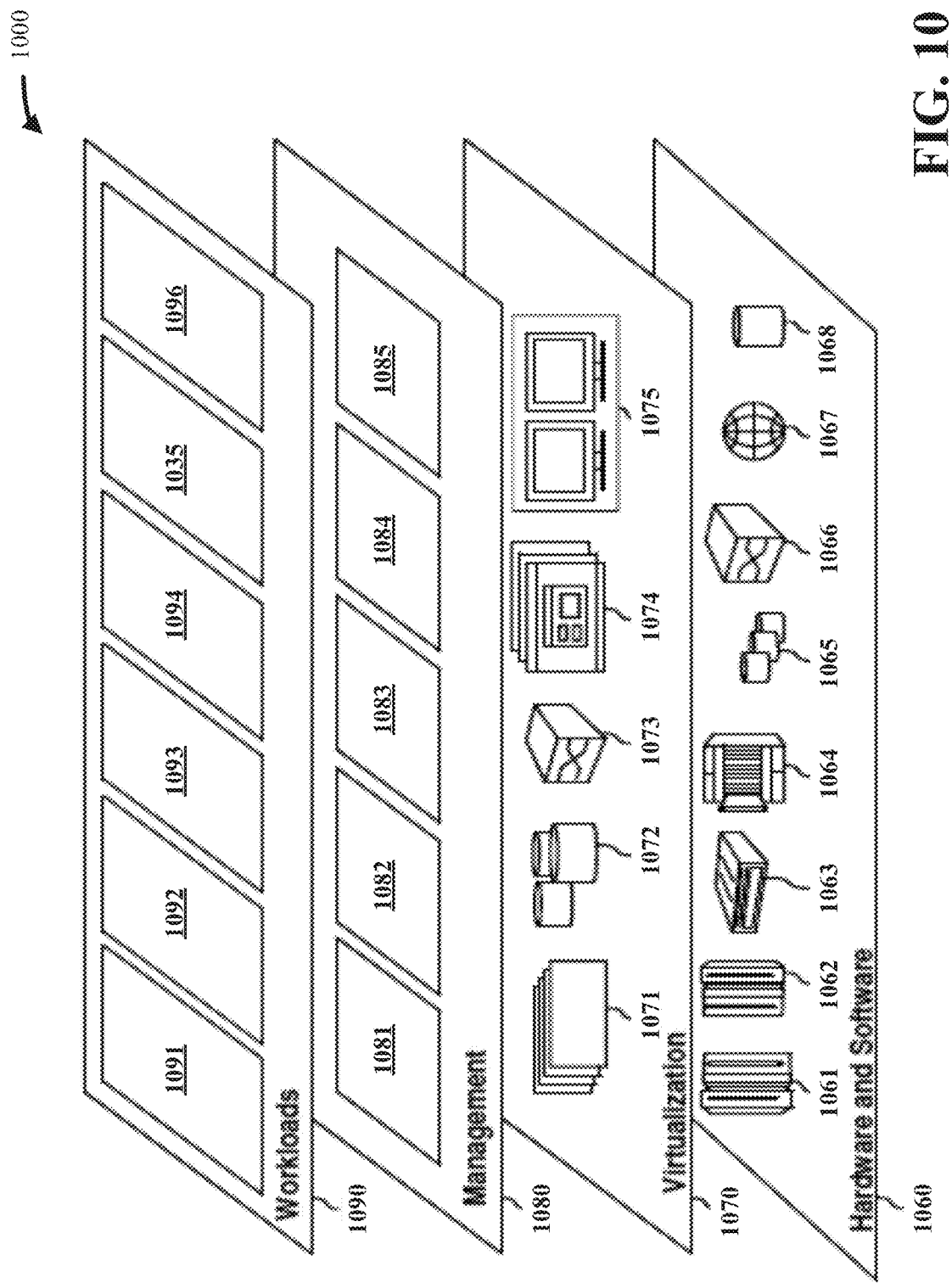
FIG. 10 illustrates a block diagram of example, non-limiting, abstraction model layers in accordance with one or more embodiments described herein.

Turning next to FIGS. 8-10, a detailed description is provided of additional context for the one or more embodiments described herein at FIGS. 1-7.

FIG. 8 and the following discussion are intended to provide a brief, general description of a suitable operating environment 800 in which one or more embodiments described herein at FIGS. 1-7 can be implemented. For example, one or more components and/or other aspects of embodiments described herein can be implemented in or be associated with, such as accessible via, the operating environment 800. Further, while one or more embodiments have been described above in the general context of computer-executable instructions that can run on one or more computers, those skilled in the art will recognize that one or more embodiments also can be implemented in combination with other program modules and/or as a combination of hardware and software.

Generally, program modules include routines, programs, components, data structures and/or the like, that perform particular tasks and/or implement particular abstract data types. Moreover, the inventive methods can be practiced with other computer system configurations, including single-processor or multiprocessor computer systems, minicomputers, mainframe computers, Internet of Things (IoT) devices, distributed computing systems, as well as personal computers, hand-held computing devices, microprocessor-based or programmable consumer electronics, and/or the like, each of which can be operatively coupled to one or more associated devices.

Computing devices typically include a variety of media, which can include computer-readable storage media, machine-readable storage media and/or communications media, which two terms are used herein differently from one another as follows. Computer-readable storage media or machine-readable storage media can be any available storage media that can be accessed by the computer and includes both volatile and nonvolatile media, removable and non-removable media. By way of example, but not limitation, computer-readable storage media and/or machine-readable storage media can be implemented in connection with any method or technology for storage of information such as computer-readable and/or machine-readable instructions, program modules, structured data and/or unstructured data.

Computer-readable storage media can include, but are not limited to, random access memory (RAM), read only memory (ROM), electrically erasable programmable read only memory (EEPROM), flash memory or other memory technology, compact disk read only memory (CD ROM), digital versatile disk (DVD), Blu-ray disc (BD) and/or other optical disk storage, magnetic cassettes, magnetic tape, magnetic disk storage and/or other magnetic storage devices, solid state drives or other solid state storage devices and/or other tangible and/or non-transitory media which can be used to store specified information. In this regard, the terms "tangible" or "non-transitory" herein as applied to storage, memory and/or computer-readable media, are to be understood to exclude only propagating transitory signals per se as modifiers and do not relinquish rights to all standard storage, memory and/or computer-readable media that are not only propagating transitory signals per se.

Computer-readable storage media can be accessed by one or more local or remote computing devices, e.g., via access requests, queries and/or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set and/or changed in such a manner as to encode information in one or more signals. By way of example, but not limitation, communication media can include wired media, such as a wired network, direct-wired connection and/or wireless media such as acoustic, RF, infrared and/or other wireless media.

With reference again to FIG. 8, the example operating environment 800 for implementing one or more embodiments of the aspects described herein can include a computer 802, the computer 802 including a processing unit 806, a system memory 804 and/or a system bus 808. One or more aspects of the processing unit 806 can be applied to processors such as 506 of the non-limiting system 500. The processing unit 806 can be implemented in combination with and/or alternatively to processors such as 506.

Memory 804 can store one or more computer and/or machine readable, writable and/or executable components and/or instructions that, when executed by processing unit 806 (e.g., a classical processor, a quantum processor and/or like processor), can facilitate performance of operations defined by the executable component(s) and/or instruction (s). For example, memory 804 can store computer and/or machine readable, writable and/or executable components and/or instructions that, when executed by processing unit 806, can facilitate execution of the one or more functions described herein relating to non-limiting system 100, as described herein with or without reference to the one or more figures of the one or more embodiments.

Memory 804 can comprise volatile memory (e.g., random access memory (RAM), static RAM (SRAM), dynamic RAM (DRAM) and/or the like) and/or non-volatile memory (e.g., read only memory (ROM), programmable ROM (PROM), electrically programmable ROM (EPROM), electrically erasable programmable ROM (EEPROM) and/or the like) that can employ one or more memory architectures.

Processing unit 806 can comprise one or more types of processors and/or electronic circuitry (e.g., a classical processor, a quantum processor and/or like processor) that can implement one or more computer and/or machine readable, writable and/or executable components and/or instructions that can be stored at memory 804. For example, processing unit 806 can perform one or more operations that can be specified by computer and/or machine readable, writable and/or executable components and/or instructions including, but not limited to, logic, control, input/output (I/O), arithmetic and/or the like. In one or more embodiments, processing unit 806 can be any of one or more commercially available processors. In one or more embodiments, processing unit 806 can comprise one or more central processing unit, multi-core processor, microprocessor, dual microprocessors, microcontroller, System on a Chip (SOC), array processor, vector processor, quantum processor and/or another type of processor. The examples of processing unit 806 can be employed to implement one or more embodiments described herein.

The system bus 808 can couple system components including, but not limited to, the system memory 804 to the processing unit 806. The system bus 808 can comprise one or more types of bus structure that can further interconnect to a memory bus (with or without a memory controller), a peripheral bus and/or a local bus using one or more of a variety of commercially available bus architectures. The system memory 804 can include ROM 810 and/or RAM 812. A basic input/output system (BIOS) can be stored in a non-volatile memory such as ROM, erasable programmable read only memory (EPROM) and/or EEPROM, which BIOS contains the basic routines that help to transfer information among elements within the computer 802, such as during startup. The RAM 812 can include a high-speed RAM, such as static RAM for caching data.

The computer 802 can include an internal hard disk drive (HDD) 814 (e.g., EIDE, SATA), one or more external storage devices 816 (e.g., a magnetic floppy disk drive (FDD), a memory stick or flash drive reader, a memory card reader and/or the like) and/or a drive 820, e.g., such as a solid state drive or an optical disk drive, which can read or write from a disk 822, such as a CD-ROM disc, a DVD, a BD and/or the like. Additionally, and/or alternatively, where a solid state drive is involved, disk 822 could not be included, unless separate. While the internal HDD 814 is illustrated as located within the computer 802, the internal HDD 814 can also be configured for external use in a suitable chassis (not shown). Additionally, while not shown in operating environment 800, a solid state drive (SSD) can be used in addition to, or in place of, an HDD 814. The HDD 814, external storage device(s) 816 and drive 820 can be connected to the system bus 808 by an HDD interface 824, an external storage interface 826 and a drive interface 828, respectively. The HDD interface 824 for external drive implementations can include at least one or both of Universal Serial Bus (USB) and Institute of Electrical and Electronics Engineers (IEEE) 1394 interface technologies. Other external drive connection technologies are within contemplation of the embodiments described herein.

The drives and their associated computer-readable storage media provide nonvolatile storage of data, data structures, computer-executable instructions, and so forth. For the computer 802, the drives and storage media accommodate the storage of any data in a suitable digital format. Although the description of computer-readable storage media above refers to respective types of storage devices, other types of storage media which are readable by a computer, whether presently existing or developed in the future, can also be used in the example operating environment, and/or that any such storage media can contain computer-executable instructions for performing the methods described herein.

A number of program modules can be stored in the drives and RAM 812, including an operating system 830, one or more applications 832, other program modules 834 and/or program data 836. All or portions of the operating system, applications, modules and/or data can also be cached in the RAM 812. The systems and/or methods described herein can be implemented utilizing one or more commercially available operating systems and/or combinations of operating systems.

Computer 802 can optionally comprise emulation technologies. For example, a hypervisor (not shown) or other intermediary can emulate a hardware environment for operating system 830, and the emulated hardware can optionally be different from the hardware illustrated in FIG. 8. In a related embodiment, operating system 830 can comprise one virtual machine (VM) of multiple VMs hosted at computer 802. Furthermore, operating system 830 can provide runtime environments, such as the JAVA runtime environment or the .NET framework, for applications 832. Runtime environments are consistent execution environments that can allow applications 832 to run on any operating system that includes the runtime environment. Similarly, operating system 830 can support containers, and applications 832 can be in the form of containers, which are lightweight, standalone, executable packages of software that include, e.g., code, runtime, system tools, system libraries and/or settings for an application.

Further, computer 802 can be enabled with a security module, such as a trusted processing module (TPM). For instance, with a TPM, boot components hash next in time boot components and wait for a match of results to secured values before loading a next boot component. This process can take place at any layer in the code execution stack of computer 802, e.g., applied at application execution level and/or at operating system (OS) kernel level, thereby enabling security at any level of code execution.

An entity can enter and/or transmit commands and/or information into the computer 802 through one or more wired/wireless input devices, e.g., a keyboard 838, a touch screen 840 and/or a pointing device, such as a mouse 842. Other input devices (not shown) can include a microphone, an infrared (IR) remote control, a radio frequency (RF) remote control and/or other remote control, a joystick, a virtual reality controller and/or virtual reality headset, a game pad, a stylus pen, an image input device, e.g., camera (s), a gesture sensor input device, a vision movement sensor input device, an emotion or facial detection device, a biometric input device, e.g., fingerprint and/or iris scanner, and/or the like. These and other input devices can be connected to the processing unit 806 through an input device interface 844 that can be coupled to the system bus 808, but can be connected by other interfaces, such as a parallel port, an IEEE 1394 serial port, a game port, a USB port, an IR interface, a BLUETOOTH® interface and/or the like.

A monitor 846 or other type of display device can be alternatively and/or additionally connected to the system bus 808 via an interface, such as a video adapter 848. In addition to the monitor 846, a computer typically includes other peripheral output devices (not shown), such as speakers, printers and/or the like.

The computer 802 can operate in a networked environment using logical connections via wired and/or wireless communications to one or more remote computers, such as a remote computer(s) 850. The remote computer(s) 850 can be a workstation, a server computer, a router, a personal computer, portable computer, microprocessor-based entertainment appliance, a peer device and/or other common network node, and typically includes many or all of the elements described relative to the computer 802, although, for purposes of brevity, only a memory/storage device 852 is illustrated. Additionally, and/or alternatively, the computer 802 can be coupled (e.g., communicatively, electrically, operatively, optically and/or the like) to one or more external systems, sources and/or devices (e.g., classical and/or quantum computing devices, communication devices and/or like device) via a data cable (e.g., High-Definition Multimedia Interface (HDMI), recommended standard (RS) 232, Ethernet cable and/or the like).

In one or more embodiments, a network can comprise one or more wired and/or wireless networks, including, but not limited to, a cellular network, a wide area network (WAN) (e.g., the Internet), or a local area network (LAN). For example, one or more embodiments described herein can communicate with one or more external systems, sources and/or devices, for instance, computing devices (and vice versa) using virtually any specified wired or wireless technology, including but not limited to: wireless fidelity (Wi-Fi), global system for mobile communications (GSM), universal mobile telecommunications system (UMTS), worldwide interoperability for microwave access (WiMAX), enhanced general packet radio service (enhanced GPRS), third generation partnership project (3GPP) long term evolution (LTE), third generation partnership project 2 (3GPP2) ultra mobile broadband (UMB), high speed packet access (HSPA), Zigbee and other 802.XX wireless technologies and/or legacy telecommunication technologies, BLUETOOTH®, Session Initiation Protocol (SIP), ZIGBEE®, RF4CE protocol, WirelessHART protocol, 6LoWPAN (IPv6 over Low power Wireless Area Networks), Z-Wave, an ANT, an ultra-wideband (UWB) standard protocol and/or other proprietary and/or non-proprietary communication protocols. In a related example, one or more embodiments described herein can include hardware (e.g., a central processing unit (CPU), a transceiver, a decoder, quantum hardware, a quantum processor and/or the like), software (e.g., a set of threads, a set of processes, software in execution, quantum pulse schedule, quantum circuit, quantum gates and/or the like) and/or a combination of hardware and/or software that facilitates communicating information among one or more embodiments described herein and external systems, sources and/or devices (e.g., computing devices, communication devices and/or the like).

The logical connections depicted include wired/wireless connectivity to a local area network (LAN) 854 and/or larger networks, e.g., a wide area network (WAN) 856. LAN and WAN networking environments can be commonplace in offices and companies and can facilitate enterprise-wide computer networks, such as intranets, all of which can connect to a global communications network, e.g., the Internet.

When used in a LAN networking environment, the computer 802 can be connected to the local network 854 through a wired and/or wireless communication network interface or adapter 858. The adapter 858 can facilitate wired and/or wireless communication to the LAN 854, which can also include a wireless access point (AP) disposed thereon for communicating with the adapter 858 in a wireless mode.

When used in a WAN networking environment, the computer 802 can include a modem 860 and/or can be connected to a communications server on the WAN 856 via other means for establishing communications over the WAN 856, such as by way of the Internet. The modem 860, which can be internal and/or external and a wired and/or wireless device, can be connected to the system bus 808 via the input device interface 844. In a networked environment, program modules depicted relative to the computer 802 or portions thereof can be stored in the remote memory/storage device 852. The network connections shown are merely exemplary and one or more other means of establishing a communications link among the computers can be used.

When used in either a LAN or WAN networking environment, the computer 802 can access cloud storage systems or other network-based storage systems in addition to, and/or in place of, external storage devices 816 as described above, such as but not limited to, a network virtual machine providing one or more aspects of storage and/or processing of information. Generally, a connection between the computer 802 and a cloud storage system can be established over a LAN 854 or WAN 856 e.g., by the adapter 858 or modem 860, respectively. Upon connecting the computer 802 to an associated cloud storage system, the external storage interface 826 can, such as with the aid of the adapter 858 and/or modem 860, manage storage provided by the cloud storage system as it would other types of external storage. For instance, the external storage interface 826 can be configured to provide access to cloud storage sources as if those sources were physically connected to the computer 802.

The computer 802 can be operable to communicate with any wireless devices and/or entities operatively disposed in wireless communication, e.g., a printer, scanner, desktop and/or portable computer, portable data assistant, communications satellite, telephone and/or any piece of equipment or location associated with a wirelessly detectable tag (e.g., a kiosk, news stand, store shelf and/or the like). This can include Wireless Fidelity (Wi-Fi) and BLUETOOTH® wireless technologies. Thus, the communication can be a predefined structure as with a conventional network or simply an ad hoc communication between at least two devices.

The illustrated embodiments described herein can be employed relative to distributed computing environments (e.g., cloud computing environments), such as described below with respect to FIG. 9, where certain tasks are performed by remote processing devices that are linked through a communications network. In a distributed computing environment, program modules can be located both in local and/or remote memory storage devices.

For example, one or more embodiments described herein and/or one or more components thereof can employ one or more computing resources of the cloud computing environment 950 described below with reference to FIG. 9, and/or with reference to the one or more functional abstraction layers (e.g., quantum software and/or the like) described below with reference to FIG. 10, to execute one or more operations in accordance with one or more embodiments described herein. For example, cloud computing environment 950 and/or one or more of the functional abstraction layers 1060, 1070, 1080 and/or 1090 can comprise one or more classical computing devices (e.g., classical computer, classical processor, virtual machine, server and/or the like), quantum hardware and/or quantum software (e.g., quantum computing device, quantum computer, quantum processor, quantum circuit simulation software, superconducting circuit and/or the like) that can be employed by one or more embodiments described herein and/or components thereof to execute one or more operations in accordance with one or more embodiments described herein. For instance, one or more embodiments described herein and/or components thereof can employ such one or more classical and/or quantum computing resources to execute one or more classical and/or quantum: mathematical function, calculation and/or equation; computing and/or processing script; algorithm; model (e.g., artificial intelligence (AI) model, machine learning (ML) model and/or like model); and/or other operation in accordance with one or more embodiments described herein.

It is to be understood that although one or more embodiments described herein include a detailed description on cloud computing, implementation of the teachings recited herein are not limited to a cloud computing environment. Rather, one or more embodiments described herein are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines and/or services) that can be rapidly provisioned and released with minimal management effort or interaction with a provider of the service. This cloud model can include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but can specify location at a higher level of abstraction (e.g., country, state and/or datacenter).

Rapid elasticity: capabilities can be rapidly and elastically provisioned, in one or more cases automatically, to quickly scale out and rapidly released to quickly scale in. To the consumer, the capabilities available for provisioning can appear to be unlimited and can be purchased in any quantity at any time.

Measured service: cloud systems automatically control and optimize resource use by leveraging a metering capability at one or more levels of abstraction appropriate to the type of service (e.g., storage, processing, bandwidth and/or active user accounts). Resource usage can be monitored, controlled and/or reported, providing transparency for both the provider and consumer of the utilized service.

Service Models are as Follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage and/or individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems and/or storage, but has control over the deployed applications and possibly application hosting environment configurations.

Infrastructure as a Service (IaaS): the capability provided to the consumer is to provision processing, storage, networks and/or other fundamental computing resources where the consumer can deploy and run arbitrary software, which can include operating systems and applications. The consumer does not manage or control the underlying cloud infrastructure but has control over operating systems, storage, deployed applications and/or possibly limited control of select networking components (e.g., host firewalls).

Deployment Models are as Follows:

Private cloud: the cloud infrastructure is operated solely for an organization. It can be managed by the organization or a third party and can exist on-premises or off-premises.

Community cloud: the cloud infrastructure is shared by several organizations and supports a specific community that has shared concerns (e.g., mission, security requirements, policy and/or compliance considerations). It can be managed by the organizations or a third party and can exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community or public) that remain unique entities but are bound together by standardized or proprietary technology that enables data and application portability (e.g., cloud bursting for load-balancing among clouds).

A cloud computing environment is service oriented with a focus on statelessness, low coupling, modularity and/or semantic interoperability. At the heart of cloud computing is an infrastructure that includes a network of interconnected nodes.

Moreover, the non-limiting system 100 and/or the example operating environment 800 can be associated with and/or be included in a data analytics system, a data processing system, a graph analytics system, a graph processing system, a big data system, a social network system, a speech recognition system, an image recognition system, a graphical modeling system, a bioinformatics system, a data compression system, an artificial intelligence system, an authentication system, a syntactic pattern recognition system, a medical system, a health monitoring system, a network system, a computer network system, a communication system, a router system, a server system, a high availability server system (e.g., a Telecom server system), a Web server system, a file server system, a data server system, a disk array system, a powered insertion board system, a cloud-based system and/or the like. In accordance therewith, non-limiting system 100 and/or example operating environment 800 can be employed to use hardware and/or software to solve problems that are highly technical in nature, that are not abstract and/or that cannot be performed as a set of mental acts by a human.

Referring now to details of one or more aspects illustrated at FIG. 9, the illustrative cloud computing environment 950 is depicted. As shown, cloud computing environment 950 includes one or more cloud computing nodes 910 with which local computing devices used by cloud consumers, such as, for example, personal digital assistant (PDA) or cellular telephone 954A, desktop computer 954B, laptop computer 954C and/or automobile computer system 954N can communicate. Although not illustrated in FIG. 9, cloud computing nodes 910 can further comprise a quantum platform (e.g., quantum computer, quantum hardware, quantum software and/or the like) with which local computing devices used by cloud consumers can communicate. Cloud computing nodes 910 can communicate with one another. They can be grouped (not shown) physically or virtually, in one or more networks, such as Private, Community, Public, or Hybrid clouds as described hereinabove, or a combination thereof. This allows cloud computing environment 950 to offer infrastructure, platforms and/or software as services for which a cloud consumer does not need to maintain resources on a local computing device. It is understood that the types of computing devices 954A-N shown in FIG. 9 are intended to be illustrative only and that cloud computing nodes 910 and cloud computing environment 950 can communicate with any type of computerized device over any type of network and/or network addressable connection (e.g., using a web browser).

Referring now to details of one or more aspects illustrated at FIG. 10, a set 1000 of functional abstraction layers is shown, such as provided by cloud computing environment 950 (FIG. 9). One or more embodiments described herein can be associated with, such as accessible via, one or more functional abstraction layers described below with reference to FIG. 10 (e.g., hardware and software layer 1060, virtualization layer 1070, management layer 1080 and/or workloads layer 1090). It should be understood in advance that the components, layers and/or functions shown in FIG. 10 are intended to be illustrative only and embodiments described herein are not limited thereto. As depicted, the following layers and/or corresponding functions are provided:

Hardware and software layer 1060 can include hardware and software components. Examples of hardware components include: mainframes 1061; RISC (Reduced Instruction Set Computer) architecture-based servers 1062; servers 1063; blade servers 1064; storage devices 1065; and/or networks and/or networking components 1066. In one or more embodiments, software components can include network application server software 1067, quantum platform routing software 1068; and/or quantum software (not illustrated in FIG. 10).

Virtualization layer 1070 can provide an abstraction layer from which the following examples of virtual entities can be provided: virtual servers 1071; virtual storage 1072; virtual networks 1073, including virtual private networks; virtual applications and/or operating systems 1074; and/or virtual clients 1075.

In one example, management layer 1080 can provide the functions described below. Resource provisioning 1081 can provide dynamic procurement of computing resources and other resources that can be utilized to perform tasks within the cloud computing environment. Metering and Pricing 1082 can provide cost tracking as resources are utilized within the cloud computing environment, and/or billing and/or invoicing for consumption of these resources. In one example, these resources can include one or more application software licenses. Security can provide identity verification for cloud consumers and/or tasks, as well as protection for data and/or other resources. User (or entity) portal 1083 can provide access to the cloud computing environment for consumers and system administrators. Service level management 1084 can provide cloud computing resource allocation and/or management such that required service levels are met. Service Level Agreement (SLA) planning and fulfillment 1085 can provide pre-arrangement for, and procurement of, cloud computing resources for which a future requirement is anticipated in accordance with an SLA.

Workloads layer 1090 can provide examples of functionality for which the cloud computing environment can be utilized. Non-limiting examples of workloads and functions which can be provided from this layer include: mapping and navigation 1091; software development and lifecycle management 1092; virtual classroom education delivery 1093; data analytics processing 1094; transaction processing 1095; and/or application transformation software 1096.

The embodiments described herein can be directed to one or more of a system, a method, an apparatus and/or a computer program product at any possible technical detail level of integration. The computer program product can include a computer readable storage medium (or media) having computer readable program instructions thereon for causing a processor to carry out aspects of the one or more embodiments described herein. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a superconducting storage device and/or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon and/or any suitable combination of the foregoing. A computer readable storage medium, as used herein, is not to be construed as being transitory signals per se, such as radio waves and/or other freely propagating electromagnetic waves, electromagnetic waves propagating through a waveguide and/or other transmission media (e.g., light pulses passing through a fiber-optic cable), and/or electrical signals transmitted through a wire.

Computer readable program instructions described herein can be downloaded to respective computing/processing devices from a computer readable storage medium and/or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the one or more embodiments described herein can be assembler instructions, instruction-set-architecture (ISA) instructions, machine instructions, machine dependent instructions, microcode, firmware instructions, state-setting data, configuration data for integrated circuitry, and/or source code and/or object code written in any combination of one or more programming languages, including an object oriented programming language such as Smalltalk, C++ or the like, and/or procedural programming languages, such as the "C" programming language and/or similar programming languages. The computer readable program instructions can execute entirely on a computer, partly on a computer, as a stand-alone software package, partly on a computer and/or partly on a remote computer or entirely on the remote computer and/or server. In the latter scenario, the remote computer can be connected to a computer through any type of network, including a local area network (LAN) and/or a wide area network (WAN), and/or the connection can be made to an external computer (for example, through the Internet using an Internet Service Provider). In one or more embodiments, electronic circuitry including, for example, programmable logic circuitry, field-programmable gate arrays (FPGA) and/or programmable logic arrays (PLA) can execute the computer readable program instructions by utilizing state information of the computer readable program instructions to personalize the electronic circuitry, in order to perform aspects of the one or more embodiments described herein.

Aspects of the one or more embodiments described herein are described with reference to flowchart illustrations and/or block diagrams of methods, apparatus (systems), and computer program products according to one or more embodiments described herein. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer and/or other programmable data processing apparatus to produce a machine, such that the instructions, which execute via the processor of the computer or other programmable data processing apparatus, can create means for implementing the functions/acts specified in the flowchart and/or block diagram block or blocks. These computer readable program instructions can also be stored in a computer readable storage medium that can direct a computer, a programmable data processing apparatus and/or other devices to function in a particular manner, such that the computer readable storage medium having instructions stored therein can comprise an article of manufacture including instructions which can implement aspects of the function/act specified in the flowchart and/or block diagram block or blocks. The computer readable program instructions can also be loaded onto a computer, other programmable data processing apparatus and/or other device to cause a series of operational acts to be performed on the computer, other programmable apparatus and/or other device to produce a computer implemented process, such that the instructions which execute on the computer, other programmable apparatus and/or other device implement the functions/acts specified in the flowchart and/or block diagram block or blocks.

The flowcharts and block diagrams in the figures illustrate the architecture, functionality and/or operation of possible implementations of systems, computer-implementable methods and/or computer program products according to one or more embodiments described herein. In this regard, each block in the flowchart or block diagrams can represent a module, segment and/or portion of instructions, which comprises one or more executable instructions for implementing the specified logical function(s). In one or more alternative implementations, the functions noted in the blocks can occur out of the order noted in the Figures. For example, two blocks shown in succession can be executed substantially concurrently, and/or the blocks can sometimes be executed in the reverse order, depending upon the functionality involved. It will also be noted that each block of the block diagrams and/or flowchart illustration, and/or combinations of blocks in the block diagrams and/or flowchart illustration, can be implemented by special purpose hardware-based systems that can perform the specified functions and/or acts and/or carry out one or more combinations of special purpose hardware and/or computer instructions.

While the subject matter has been described above in the general context of computer-executable instructions of a computer program product that runs on a computer and/or computers, those skilled in the art will recognize that the one or more embodiments herein also can be implemented in combination with one or more other program modules. Generally, program modules include routines, programs, components, data structures and/or the like that perform particular tasks and/or implement particular abstract data types. Moreover, the inventive computer-implemented methods can be practiced with other computer system configurations, including single-processor and/or multiprocessor computer systems, mini-computing devices, mainframe computers, as well as computers, hand-held computing devices (e.g., PDA, phone), microprocessor-based or programmable consumer and/or industrial electronics and/or the like. The illustrated aspects can also be practiced in distributed computing environments in which tasks are performed by remote processing devices that are linked through a communications network. However, one or more, if not all aspects of the one or more embodiments described herein can be practiced on stand-alone computers. In a distributed computing environment, program modules can be located in both local and remote memory storage devices.

As used in this application, the terms "component," "system," "platform," "interface," and/or the like, can refer to and/or can include a computer-related entity or an entity related to an operational machine with one or more specific functionalities. The entities described herein can be either hardware, a combination of hardware and software, software, or software in execution. For example, a component can be, but is not limited to being, a process running on a processor, a processor, an object, an executable, a thread of execution, a program and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system and/or across a network such as the Internet with other systems via the signal). As another example, a component can be an apparatus with specific functionality provided by mechanical parts operated by electric or electronic circuitry, which is operated by a software and/or firmware application executed by a processor. In such a case, the processor can be internal and/or external to the apparatus and can execute at least a part of the software and/or firmware application. As yet another example, a component can be an apparatus that provides specific functionality through electronic components without mechanical parts, where the electronic components can include a processor and/or other means to execute software and/or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter described herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit and/or device comprising, but not limited to, single-core processors; single-processors with software multithread execution capability; multi-core processors; multi-core processors with software multithread execution capability; multi-core processors with hardware multithread technology; parallel platforms; and/or parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, and/or any combination thereof designed to perform the functions described herein. Further, processors can exploit nano-scale architectures such as, but not limited to, molecular and quantum-dot based transistors, switches and/or gates, in order to optimize space usage and/or to enhance performance of related equipment. A processor can be implemented as a combination of computing processing units.

Herein, terms such as "store," "storage," "data store," "data storage," "database," and substantially any other information storage component relevant to operation and functionality of a component are utilized to refer to "memory components," entities embodied in a "memory," or components comprising a memory. Memory and/or memory components described herein can be either volatile memory or nonvolatile memory or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory and/or nonvolatile random access memory (RAM) (e.g., ferroelectric RAM (FeRAM). Volatile memory can include RAM, which can act as external cache memory, for example. By way of illustration and not limitation, RAM can be available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM) and/or Rambus dynamic RAM (RDRAM). Additionally, the described memory components of systems and/or computer-implemented methods herein are intended to include, without being limited to including, these and/or any other suitable types of memory.

What has been described above includes mere examples of systems and computer-implemented methods. It is, of course, not possible to describe every conceivable combination of components and/or computer-implemented methods for purposes of describing the one or more embodiments, but one of ordinary skill in the art can recognize that many further combinations and/or permutations of the one or more embodiments are possible. Furthermore, to the extent that the terms "includes," "has," "possesses," and the like are used in the detailed description, claims, appendices and/or drawings such terms are intended to be inclusive in a manner similar to the term "comprising" as "comprising" is interpreted when employed as a transitional word in a claim.

The descriptions of the one or more embodiments have been presented for purposes of illustration but are not intended to be exhaustive or limited to the embodiments described herein. Many modifications and variations will be apparent to those of ordinary skill in the art without departing from the scope and spirit of the described embodiments. The terminology used herein was chosen to best explain the principles of the embodiments, the practical application and/or technical improvement over technologies found in the marketplace, and/or to enable others of ordinary skill in the art to understand the embodiments described herein.

What is claimed is:

1. A method, comprising:
   forming, by self-aligned quadruple patterning (SAQP), by a system operatively coupled to a processor, an interconnect structure of a semiconductor device, the interconnect structure having a first set of parallel lines and a second set of parallel lines, wherein the parallel lines of the first set are arranged in a transverse direction to the parallel lines of the second set, wherein the forming comprises:
   applying, by the system, a conformal spacer about a mandrel having first and second portions transverse to one another, and
   removing, by the system, the mandrel to form the first set of parallel lines and the second set of parallel lines comprising a rounded jog connecting one line of the first set and one line of the second set.

2. The method of claim 1, wherein the forming comprises:
   forming, by the system, the parallel lines of the first set are disposed orthogonally to the parallel lines of the second set.

3. The method of claim 1, wherein the forming comprises:
   forming, by the system, the parallel lines of the first set at a first pitch of 18 nanometers or less; and
   forming, by the system, the parallel lines of the second set at a second pitch of 18 nanometers or less.

4. The method of claim 1, wherein the forming comprises:
   using, by the system, one or more comb-shaped mandrels.

5. The method of claim 1, wherein the first set of parallel lines and the second set of parallel lines together define a comb-serpentine structure.

6. The method of claim 1, further comprising forming a set of vias connected across the interconnect structure.

7. The method of claim 5, wherein the rounded jog is a first rounded jog, and wherein the forming further comprises:

applying, by the system, another conformal spacer about the first set of parallel lines and the second set of parallel lines; and removing, by the system, the another conformal spacer to at least in part form the first set of parallel lines and the second set of parallel lines comprising comprise the first rounded jog and a second rounded jog that are conformal to one another and which connect the first set of parallel lines to the second set of parallel lines.

8. A device, comprising:
a semiconductor device having an interconnect structure, wherein the interconnect structure comprises a first set of parallel lines and a second set of parallel lines, and wherein the parallel lines of the first set are arranged in a transverse direction to the parallel lines of the second set, wherein the first set of parallel lines and the second set of parallel lines comprise a rounded jog connecting one line of the first set and one line of the second set.

9. The device of claim 8, wherein the parallel lines of the first set are disposed orthogonally to the parallel lines of the second set.

10. The device of claim 8, wherein the parallel lines of the first set are arranged a first pitch of 18 nanometers or less, and wherein the parallel lines of the second set are arranged a second pitch of 18nanometers or less.

11. The device of claim 8, wherein the rounded jog is a first rounded jog, and wherein the first set of parallel lines and the second set of parallel lines comprise the first rounded jog and a second rounded jog that are conformal to one another and which connect the first set of parallel lines to the second set of parallel lines.

12. The device of claim 8, wherein the first set of parallel lines and the second set of parallel lines together define a comb-serpentine structure.

13. The device of claim 8, further comprising:
a plurality of disconnected sections of the interconnect structure that are disconnected from one another.

14. A system, comprising:
a semiconductor device comprising a circuit, wherein the circuit comprises:
an interconnect structure having a first set of parallel lines and a second set of parallel lines, wherein the parallel lines of the first set are arranged in a transverse direction to the parallel lines of the second set, wherein the first set of parallel lines and the second set of parallel lines comprise a rounded jog connecting one line of the first set and one line of the second set; and
a set of vias connected across the interconnect structure.

15. The system of claim 14, wherein the parallel lines of the first set are disposed orthogonally to the parallel lines of the second set.

16. The system of claim 14, wherein the parallel lines of the first set are arranged a first pitch of 18 nanometers or less, and wherein the parallel lines of the second set are arranged a second pitch of 18 nanometers or less.

17. The system of claim 14, wherein the rounded jog is a first rounded jog, and wherein the first set of parallel lines and the second set of parallel lines comprise the first rounded jog and a second rounded jog that are conformal to one another and which connect the first set of parallel lines to the second set of parallel lines.

18. The system of claim 14, further comprising:
the set of vias electrically connected to the interconnect structure and vias of the set of vias electrically connected to one another across disconnected sections of the interconnect structure.

19. The system of claim 14, further comprising:
the semiconductor device having a charge applied across disconnected sections of the interconnect structure via the set of vias.

20. The system of claim 14, wherein the first set of parallel lines and the second set of parallel lines together define a comb-serpentine structure.

* * * * *